United States Patent [19]
So

[11] Patent Number: 4,477,772
[45] Date of Patent: Oct. 16, 1984

[54] FREQUENCY COMPENSATOR FOR A CURRENT-COMPARATOR CAPACITANCE BRIDGE

[75] Inventor: Eddy So, Ottawa, Canada

[73] Assignee: Canadian Patents & Development Limited, Ottawa, Canada

[21] Appl. No.: 363,143

[22] Filed: Mar. 29, 1982

[51] Int. Cl.³ .................. G01R 11/52; G01R 27/26
[52] U.S. Cl. .......................... 324/59; 324/DIG. 1
[58] Field of Search ............. 324/59, DIG. 1, 55, 324/57 R, 60 R

[56] References Cited

FOREIGN PATENT DOCUMENTS 277087  5/1971  U.S.S.R. ................................ 324/59
270882  5/1971  U.S.S.R. ................................ 324/59

OTHER PUBLICATIONS

Foley: "Direct Reading Non-Frequency-Sensitive Current Comparator Bridges for Measurements on Capacitors and Reactors", IEEE Proceedings Southeast Con.—Apr. 1979—pp. 337–340.

Primary Examiner—Stanley T. Krawczewicz
Assistant Examiner—Jose M. Solis
Attorney, Agent, or Firm—Edward Rymek

[57] ABSTRACT

A method and apparatus for rendering a high-voltage current-comparator capacitance bridge insensitive to frequency fluctuations when used for measuring inductance. A compensating current, proportional to twice the change in the current through the reference capacitor due to frequency fluctuations, is driven into the first comparator winding, through which the current from the reference capacitor passes, resulting in a current in that winding having frequency characteristics similar to those of the current passing through the second winding, which is connected to the inductance. This compensating current is derived from a reduced replica of the applied high-voltage or from the current through the reference capacitor.

8 Claims, 4 Drawing Figures

FREQUENCY COMPENSATOR FOR A CURRENT-COMPARATOR CAPACITANCE BRIDGE

BACKGROUND OF THE INVENTION

This invention is directed to a current comparator capacitance bridge for the measurement of inductance, and, in particular, to a frequency fluctuation compensation for such a bridge.

A current-comparator capacitance bridge which is adapted to the measurement of an inductance, such as an inductive shunt reactor, by providing the means to reverse the phase of the reactor current and tangent balance is described in the publication, "Measurement of Shunt Reactor Loss at High Voltage with an Alternating Current-Comparator Bridge", W. J. M. Moore et al, IEEE Trans. on Power Apparatus and Systems, Vol. PAS-92, No. 2, pp 662–667, March/April 1973. The comparison of an inductance to a capacitive reference results in a bridge which is frequency sensitive.

To overcome this deficiency, a modified current-comparator capacitance bridge was proposed in the publication, "Mesures des Pertes dans les Réactances Shunt EHT par un pont C-tan δ Insensibilisé aux Fluctuations de la FrAUC/e/ quence du Réseau", R. Malewski et al, Conference Digest IEEE Canadian Communications and Power Conference, Montreal, Canada, Oct. 18-20, 1978, ch. 1373-0, Reg. 7, pp 487–491. This proposed modified bridge was used in a study entitled, "Interlaboratory Comparison of EHV Shunt Reactor Loss Measurements", R. Malewski et al, IEEE Trans. on Power Apparatus and Systems, Vol. PAS-99, No. 4, pp 1634–1641, July/Aug. 1980. In this modified bridge, the comparator winding in the reference capacitor arm of the bridge, is driven by a current proportional to the integral of a voltage which is a reduced replica of the applied high voltage to the bridge. The frequency characteristics of the reference arm of this modified bridge thus simulate those of the reactor, and the operating difficulties of the current-comparator-based capacitance bridge due to slight variations in frequency are overcome. The accuracy and long-term stability of the current-comparator have been exchanged, however, for those of the electronic circuitry that has been inserted between the reference capacitor and the comparator winding.

SUMMARY OF THE INVENTION

It is therefore an object of this invention to render a current-comparator capacitance bridge insensitive to frequency fluctuations while maintaining the inherent high accuracy and long-term stability of the basic bridge.

This and other objects are achieved in a current comparator capacitance bridge for measuring inductance wherein the bridge includes a first comparator winding connected to a reference capacitor, second comparator winding for connection to the inductance, and a comparator amplifier connected to the first comparator windings for providing an output voltage which is a reduced replica of the voltage applied to the bridge. The bridge is rendered insensitive to frequency fluctuations by deriving a compensating current proportional to twice the change in current through the reference capacitor due to frequency fluctuations, and driving this compensating current through the first comparator winding to produce a current in the first winding having frequency characteristics similar to those of the current in the second comparator winding. The compensating current may be derived either from the output of the comparator amplifier, or from the current through the reference capacitor.

The derived compensating current is driven into the first comparator winding by an amplifier and a fixed resistor.

The circuit for deriving the compensating current from the comparator amplifier output may include a series-connected integrator and resistor connected to the comparator amplifier, thereby providing a first current, and a series-connected differentiator and resistor connected to the comparator amplifier, thereby providing a second current. A summing circuit adds the first and second currents to provide the compensating current.

The circuit for deriving the compensating current from the current through the reference capacitor may include a current transformer having a primary transformer winding connected in series with the reference capacitor and the first comparator winding, and a secondary transformer winding connected to a current-to-voltage converter. A double integrator and resistor are series connected to the converter, to provide a first current. A summing circuit adds the first current from the integrator circuit to a current derived from the converter voltage applied to a resistor, to provide the compensating current.

The compensator may further include an inverting amplifier and a fixed resistor equal in magnitude to the fixed resistor used to drive the compensating current into the first comparator winding, connected to the summing circuit to apply a current to the comparator amplifier.

Many other objects and aspects of the invention will be clear from the detailed description of the drawings.

DETAILED DESCRIPTION

Figure 1:
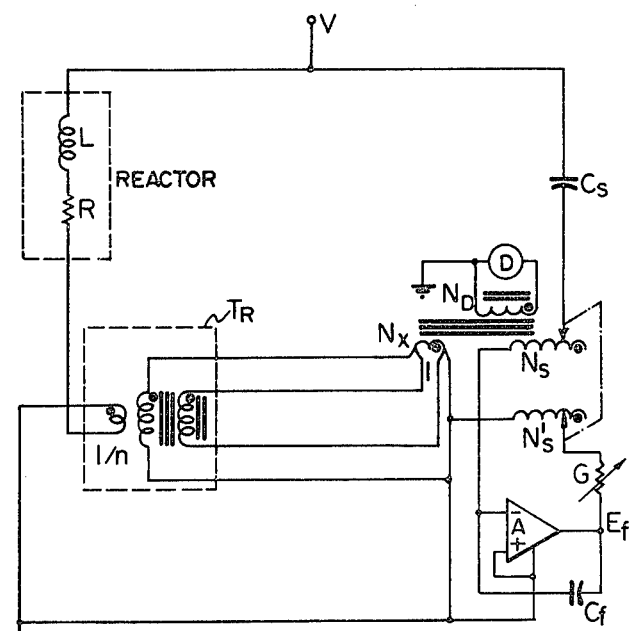
FIG. 1 illustrates a prior art current-comparator capacitance bridge.
Figure 2:
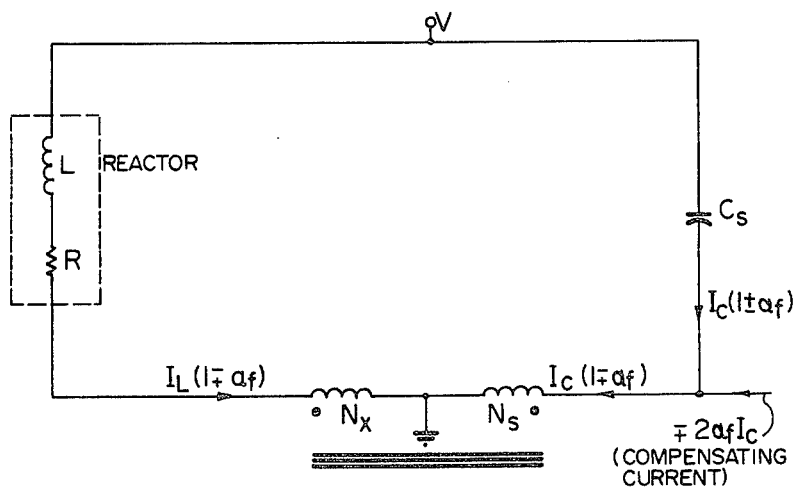
FIG. 2 illustrates the method of compensating frequency variations in accordance with the present invention.
Figure 2:
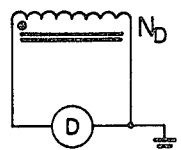

FIG. 1 shows the basic current-comparator capacitance bridge described in the above referenced 1973 publication by W. J. M. Moore et al, which is incorporated herein by reference. The bridge consists essentially of a current comparator which compares the current from a standard high voltage capacitor $C_S$ with the current from an inductive reactor L-R to be measured. The current comparator includes first winding $N_S$ connected to the reference capacitance $C_S$, second winding $N_X$ connected to the inductance L-R, and detector winding $N_D$. In FIG. 1, the current from the inductor L-R has been reduced and inverted in phase by a two-stage, n/1 ratio, current transformer $T_R$. Quadrature balance is obtained from an operational amplifier A with a feedback capacitor $C_f$ and an adjustable conductance G connected to a winding $N_S'$ of the same number of turns as winding $N_S$. The bridge is balanced by adjustment of $N_S$ and G. The current through the reference capacitor $C_S$ is passed to the comparator winding $N_S$ and thence to the input of operational amplifier A, which is virtually at ground potential. The output voltage $E_f$ of amplifier A is a replica of the applied high-voltage V but reduced in magnitude by the ratio $C_S/C_f$. This voltage $E_f$, with conductance G and the second comparator winding $N_S'$ provides the direct indication of tangent $\delta$. The inductive balance of this bridge is sensitive to the square of the frequency, but the conductance G or tangent $\delta$ balance is frequency independent. FIG. 2 illustrates the method in accordance with the present invention of frequency compensating a current-comparator capacitance bridge. The current $I_C(1\pm\alpha_f)$ flows through the reference capacitor $C_S$, where $\alpha_f$ is the fractional change in the frequency $\Delta f/f$, and is passed to the comparator winding $N_S$. The current $I_L(1\mp\alpha_f)$ flows through the inductance L-R. A compensating current proportional to twice the change in the current through the reference capacitor $C_S$ due to variations in frequency, $\mp 2\alpha_f I_C$, is forced into the comparator winding $N_S$, resulting in a current $I_C(1\mp\alpha_f)$ in winding $N_S$ that has frequency characteristic similar to those of the current $I_L(1\mp\alpha_f)$ through the inductance L-R. The compensating current which is only a small fraction of the current through the reference capacitor $C_S$ need not be supplied with great accuracy. The effect of frequency fluctuations on the inductive balance of the bridge is eliminated without sacrificing the inherent high accuracy and long-term stability of the high-voltage current-comparator capacitance bridge.

In the current comparator shown in FIG. 1, the required compensating current may be derived from the output voltage $E_f$ of amplifier A or from the current through the reference capacitor $C_S$. Circuits for deriving the compensating currents are shown in FIGS. 3 and 4.

Figure 3:
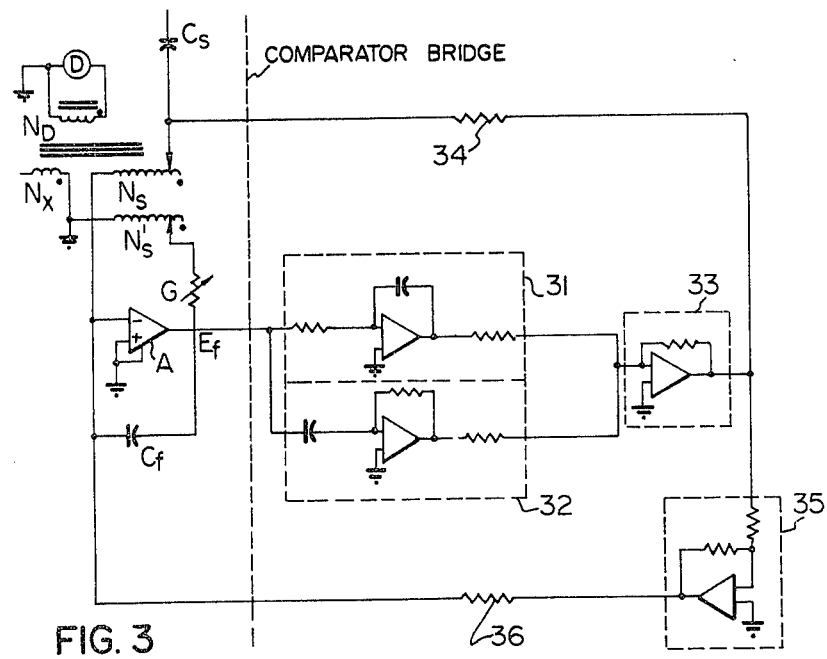
FIG. 3 shows one embodiment of a frequency compensator.

In the circuit shown in FIG. 3, the compensating current is derived from the current comparator output voltage $E_f$. The voltage $E_f$ is integrated by an integrator 31 which through an output resistor provides a current proportional to $-I_C(1\mp\alpha_f)$. The voltage $E_f$ is also differentiated in a differentiator 32 which through an output resistor, provides a current proportional to $+I_C(-1\pm\alpha_f)$. These two currents are summed in a summing amplifier 33 to provide a current proportional to the compensating current $\mp 2\alpha_f I_C$. This current is driven into the comparator winding $N_S$ through a resistor 34.

In addition, in order to avoid second-order errors in the bridge reading, a current equal in magnitude to the compensating current may be drawn from the inverting input of amplifier A in the comparator bridge. This is done by feeding the output of summing amplifier 33 to a unity-gain inverting amplifier 35, the output of which is fed to amplifier A through a resistor 36 which is equal in magnitude to resistor 34.

Figure 4:
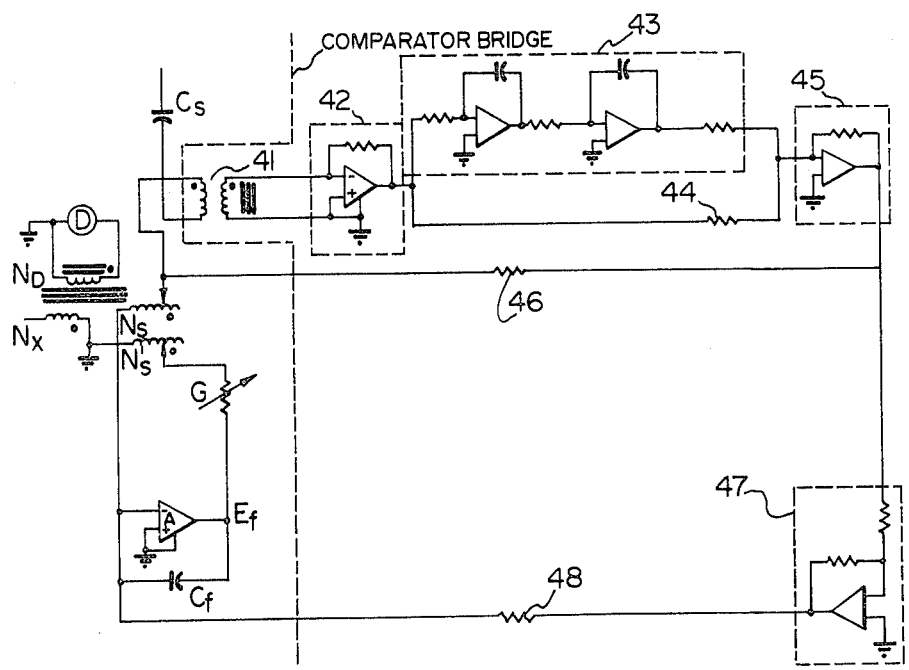
FIG. 4 an alternate embodiment of a frequency compensator.

In the circuit shown in FIG. 4, the compensating current is derived from the current through the reference capacitor $C_S$ in the comparator. The primary winding of a current transformer 41 is connected in series with the reference capacitor $C_S$ and the winding $N_S$ in the comparator bridge. The secondary winding of transformer 41 is connected to a current-to-voltage converter 42 to obtain a voltage proportional to, and in phase with, the current $I_C(1\pm\alpha_f)$ through the reference capacitor $C_S$. This output is fed to an integrator pair 43 which, through a resistor, provides an output proportional to $-I_C(1\mp\alpha_f)$. This output current is added to a current proportional to $I_C(1\pm\alpha_f)$ provided through resistor 44, by a summing circuit 45 to provide an output current proportional to the compensating current $\mp 2\alpha_f I_C$. This current is driven into the comparator winding $N_S$ through a resistor 46.

As with the circuit in FIG. 3, second-order errors may be avoided by drawing a current equal in magnitude to the compensating current from the inverting input of amplifier A in the comparator bridge. The output of summing amplifier 45 is fed to a unity-gain inverting amplifier 47, the output of which is fed to amplifier A through a resistor 48 equal in magnitude to resistor 46.

The accuracy of the frequency compensated capacitance bridge depends to a first-order on the basic accuracy of the current-comparator-based capacitance bridge and to a second-order on the accuracy of the compensating current circuit. However, it must be adjusted for zero output compensating current at a frequency of 60 Hz ($\alpha_f=0$) or an offset error, which is first-order, would be introduced into the balance of the bridge and corrections would have to be applied to the bridge reading accordingly. For zero offset error, the error introduced by the compensating current circuit into the balance of the bridge is proportional to twice the maximum fractional change of the frequency of the applied high voltage and to the accuracy of the compensating current circuit. For a 0.1% maximum fractional change in the frequency of the applied high-voltage and a 0.1% accuracy of the compensating circuit, the error introduced into the balance of the bridge is only 0.0002% or 2 parts per million (ppm). This applies mainly to the inductive balance of the bridge. The tangent $\delta$ balance is hardly affected and it remains essentially the same. An accuracy of better than 0.1% in the compensating current circuit is easily obtained. Thus, for small variation in the frequency of the applied high-voltage, the accuracy of the frequency-compensated capacitance bridge is approximately the same as the basic accuracy of the current-comparator-based capacitance bridge which is 10 ppm for both the reactance balance and the tangent $\delta$ balance.

Many modifications in the above described embodiments of the invention can be carried out without departing from the scope thereof and, therefore, the scope of the present invention is intended to be limited only by the appended claims.

I claim:

1. In a current comparator capacitance bridge for measuring inductance wherein the bridge includes first comparator winding connected to a reference capacitor and second comparator winding for connection to the inductance, a method for rendering the bridge insensitive to frequency fluctuations comprising:
    deriving a compensating current proportional to twice the change in current through the reference capacitor due to the frequency fluctuations; and
    driving the compensating current through the first comparator windings to produce a current in the first winding having frequency characteristics similar to those of the current in the second comparator winding.

2. A method as claimed in claim 1 wherein the step of deriving the compensating current includes:
    deriving a reduced replica of a voltage applied to the bridge; and summing currents obtained from the integral and the derivative of the derived voltage.

3. A method as claimed in claim 1 wherein the step of deriving the compensating current includes:
   detecting the current flowing through the reference capacitor;
   converting the detected current to a proportional voltage; and
   summing the detected current with the current obtained from the double integration of the proportional voltage.

4. In a current comparator capacitance bridge for measuring inductance wherein the bridge includes first comparator winding connected to a reference capacitor, second comparator winding for connection to the inductance, and a comparator amplifier connected to the first comparator winding for providing a reduced replica of a voltage applied to the bridge, a compensator for rendering the bridge insensitive to frequency fluctuations comprising:
   means for deriving a compensating current proportional to twice the current change in the reference capacitor due to frequency fluctuations; and
   means for driving the compensating current through the first comparator winding to produce a current in the first winding having frequency characteristics similar to those of the current through the second comparator winding.

5. A compensator as claimed in claim 1 wherein the compensating current driving means includes amplifier means and a fixed resistor connected to the first comparator winding.

6. A compensator as claimed in claim 4 or 5 wherein the compensating current deriving means includes:
   a series-connected integrator and resistor connected to the comparator amplifier, to provide a first current;
   a series-connected differentiator and resistor connected to the comparator amplifier to provide a second current; and
   a summing circuit for adding the first and second current to provide the compensating current.

7. A compensator as claimed in claim 4 or 5 wherein the compensating current deriving means includes:
   a current transformer having a primary transformer winding connected in series with the reference capacitor and the first comparator winding, and a secondary transformer winding;
   a current-to-voltage converter connected to the secondary transformer winding;
   a double integrator and resistor series connected to the converter;
   a summing circuit adding the current from the integrator circuit and a current derived from the converter voltage applied to a resistor, to provide the compensating current.

8. A compensator as claimed in claim 5 which further includes an inverting amplifier and a fixed resistor connected to the summing circuit, the fixed resistor being equal in magnitude to the driving means fixed resistor, for applying a current to the comparator amplifier.

* * * * *